United States Patent [19]
Nakamura

[11] Patent Number: 5,923,688
[45] Date of Patent: Jul. 13, 1999

[54] SEMICONDUCTOR LASER

[75] Inventor: Takahiro Nakamura, Tokyo, Japan

[73] Assignee: NEC Corporation, Tokyo, Japan

[21] Appl. No.: 08/921,164

[22] Filed: Aug. 29, 1997

[30] Foreign Application Priority Data

Sep. 2, 1996 [JP] Japan ................................ 8-231843

[51] Int. Cl.⁶ .................................................... H01S 3/19
[52] U.S. Cl. ................................................ 372/45; 372/46
[58] Field of Search .......................................... 372/45, 46

[56] References Cited

U.S. PATENT DOCUMENTS

| 5,509,026 | 4/1996 | Sasaki et al. | 372/45 |
| 5,753,933 | 5/1998 | Morimoto | 372/46 |

FOREIGN PATENT DOCUMENTS

| 5-110193 | 4/1993 | Japan . |
| 6-77592 | 3/1994 | Japan . |
| 6-268315 | 9/1994 | Japan . |
| 7-221395 | 8/1995 | Japan . |
| 7-263804 | 10/1995 | Japan . |
| 9-260766 | 10/1997 | Japan . |

OTHER PUBLICATIONS

Yamashita, S. et al., "Low–Threshold (3.2 mA per Element) 1.3 βm InGaAsP MQW Laser Array on a p–Type Substrate", *IEEE Photonics Technology Letters*, vol. 4, No. 9, Sep. 1992, pp. 954–957.

*Primary Examiner*—Rodney Bovernick
*Assistant Examiner*—Yisun Song
*Attorney, Agent, or Firm*—Foley, Hoag & Eliot LLP

[57] ABSTRACT

A semiconductor laser is herein disclosed which comprises an active layer 21 and SCH layers which sandwich the active layer 21 from upper and lower sides, wherein the SCH layer comprises a multi-layer structure of 2 or more layers 22,24, 23,25, and this multi-layer structure is constituted so that the band gaps of the respective layers may increase as the multi-layer structure is apart from the active layer.

20 Claims, 6 Drawing Sheets

○ (a) In the case that the SCH layer has a bandgap of 1.13 μm and a thickness of 60 nm.

△ (b) In the case that the SCH layer has a bandgap of 1.13 μm and a thickness of 40 nm.

□ (c) In the case that the SCH layer comprises a two-layer structure of a layer having a bandgap of 1.13 μm and a thickness of 20 nm and another layer having a bandgap of 1.05 μm and a thickness of 40 nm.

○ (a) In the case that the SCH layer has a bandgap of 1.13 μm and a thickness of 60 nm.

△ (b) In the case that the SCH layer has a bandgap of 1.13 μm and a thickness of 40 nm.

SEMICONDUCTOR LASER

BACKGROUND OF THE INVENTION (i) Field of the Invention

The present invention relates to a semiconductor laser, and more specifically, it relates to a semiconductor laser for use in an optical communication system.

(ii) Description of the Prior Art

With the progress of an optical communication technique, an applicable field of a semiconductor laser is rapidly spreading from a trunk transmission network to systems such as a subscriber system, LAN and data link. Particularly, in order to realize a total optical communication of from a communication center to each home, much attention has been paid to a passive double star (PDS), a passive optical network (PON) and the like where an original signal is distributed by an optical star coupler which is a passive part, for the reason why they are inexpensive. In these systems, a laser has been desired by which a high output operation can be carried out at a low drive current at a high temperature and a loss by the distribution of the original signal can be compensated. Therefore, there has been employed a method which comprises introducing a strained MQW structure into an active layer to change a band structure and to thereby increase a gain.

FIG. 6 shows a band structure of an active layer which is constituted of a strained MQW layer 4 comprising a well layer 11 and a barrier layer 12 formed by MOVPE growth, and a single SCH layer 5 having the same composition as in the barrier layer 12 (IEEE Photonics Technology Letters, Vol. 4, No. 9, September 1992, p. 954–957). In order to operate this semiconductor layer at a high temperature at a high output, it is necessary to increase an amount of light (an optical confinement coefficient) which is confined in the well layer, and so the thickness of an SCH (a separate confinement heterostructure) layer 5 is as thick as 100 nm. However, if the SCH layer is thick, there occur the deterioration of a carrier transportation efficiency by the recombination of carriers running through the SCH layer and the increase of an optical loss by free carrier plasma oscillation, so that the efficiency of the semiconductor laser deteriorates inconveniently.

SUMMARY OF THE INVENTION

In order to efficiently operate the above semiconductor laser under a high-temperature environment, it is necessary to control an internal loss by the increase of carriers in an active layer and the reduction of an internal quantum efficiency by the overflow of the carriers from the active layer. An object of the present invention is to provide a semiconductor laser for optical communication by which the above problems can be solved and in which a highly efficient operation is possible at a high temperature.

The slope efficiency of the laser depends on the internal quantum efficiency and the internal loss. As the internal quantum efficiency is high and the internal loss is low, the laser having the high efficiency can be obtained. Thus, the influence of a layer thickness and a temperature on the above two parameters was inspected. The results are shown in FIG. 3.

For the decrease of the internal loss, at room temperature, it is advantageous that the layer thickness is small, because the increase of the internal loss by the deterioration of the carrier transportation efficiency can be restrained. In the case that the layer thickness is small, however, the internal loss is remarkably large at the high temperature [(b) in FIG. 3]. This phenomenon is considered to be caused by a fact that the carriers are present at a high concentration in a limited region, so that a plasma loss becomes remarkable with the rise of the temperature. On the other hand, with regard to the internal quantum efficiency, the temperature dependency can be reduced by decreasing the layer thickness.

The present inventor have intensively investigated in view of the above experimental results, and as a result, it has been found that the internal loss at the high temperature can efficiently be reduced, while the internal quantum efficiency is maintained at a high level, by the use of an SCH layer in the form of a multi-layer structure. One example of a band structure in the case that the SCH layer is used in the form of the multi-layer structure is shown in FIG. 4(c). It is one feature that the region of the existing carriers is different at room temperature and at the high temperature.

At room temperature, the carriers are confined in the first SCH layer, and hence the same state as in the case that the SCH layer is thinned can be obtained, so that the internal quantum efficiency heightens and the internal loss decreases. At the time of the high temperature, there can be attained a constitution where a part of the carriers in the first SCH layer are released, and therefore the problem of the plasma loss caused by the carriers present at the high concentration can be solved. Furthermore, instead of a constitution that the carriers are uniformly distributed in a wide range as in the case that the layer thickness is increased [FIG. 4(a)], most of the carriers are present in the first SCH layer and a part of the carriers are present in the second SCH layer (the SCH layer at the second from the active layer) [the drawing at the high temperature in FIG. 4(c)]. In consequence, the deterioration of the carrier transportation efficiency which is the problem in the case that the layer thickness is increased can be restrained, and the deterioration of the internal quantum efficiency can also be prevented.

As described above, in order to operate the semiconductor laser at a high output, it is necessary to increase the quantity of the light confined in the well layer, and the SCH layer must be thickened. The semiconductor laser of the present invention can restrain the deterioration of the efficiency of the laser in the case that the SCH is thickened and can realize the high efficiency in a wide temperature range.

That is to say, the semiconductor laser of the present invention has a structure by which the increase of the internal loss by the increase of the carriers in the active layer and the deterioration of the internal quantum efficiency by the overflow of the carriers from the active layer can efficiently be restrained, whereby the highly efficient operation at the high-temperature can be achieved.

The first aspect of the present invention is directed to a semiconductor laser having such effects which comprises an active layer, and a p-type SCH layer and an n-type SCH layer which sandwich the active layer from upper and lower sides, wherein the n-type SCH layer comprises a multi-layer structure of 2 or more layers, and this multi-layer structure is constituted so that the band gaps of the respective layers may increase as the multi-layer structure is apart from the active layer. The second aspect of the present invention is directed to the semiconductor laser wherein the p-type SCH layer comprises a multi-layer structure of 2 or more layers, and this multi-layer structure is constituted so that the band gaps of the respective layers may increase, as these layers are apart from the active layer. The third aspect of the present invention is directed to the semiconductor laser wherein each thickness of the p-type SCH layer and the n-type SCH layer which sandwich the active layer from upper and lower sides is in the range of 10 to 60 nm. The fourth aspect of the present invention is directed to the semiconductor laser wherein the active layer has a quantum well structure or a strained quantum well structure. The fifth aspect of the present invention is directed to the semiconductor laser wherein an energy of a bottom of a conduction band of the SCH layer comprising a multi-layer structure which is present at the second from the active layer is higher than a quasi Fermi level of electrons at room temperature and lower than a quasi Fermi level of the electrons at 85° C.

DETAILED DESCRIPTION OF THE PREFERRED EMBODIMENTS

Figure 1:
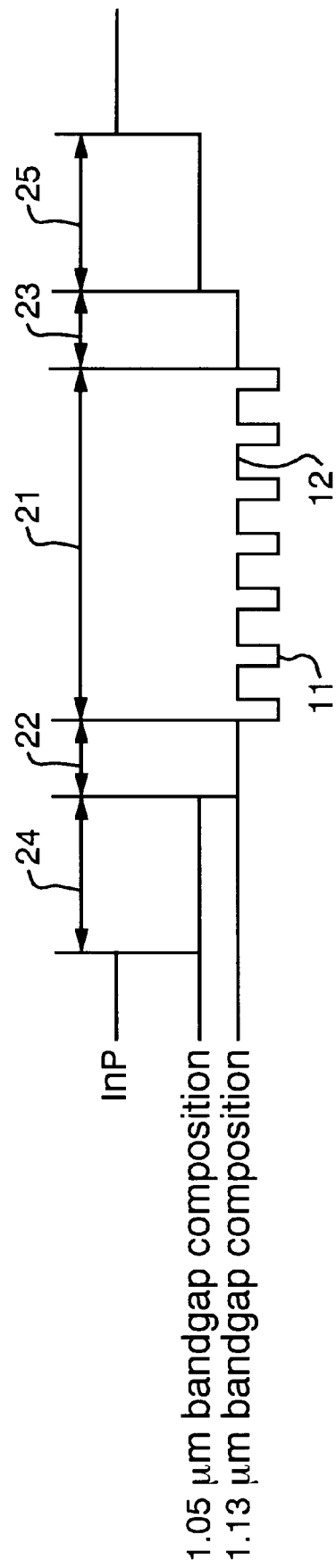
FIG. 1 shows a band structure of a semiconductor laser of the present invention.

An embodiment of a semiconductor laser of the present invention will be described with reference to FIG. 7. The semiconductor laser of the present invention has SCH layers comprising a multi-layer structure. On the surface and the back surface of a strained multi quantum well active layer 21, first SCH layers 22, 23 are formed, respectively. Furthermore, on the outsides of the first SCH layers, second SCH layers 24, 25 are formed, respectively. In addition, on the outsides of the second SCH layers, clad layers 26, 27 are formed, respectively. In the drawing, an n-type substrate 28 is used, and an n-type SCH layer and a p-type SCH layer are formed on the back surface and on the surface of the active layer, respectively, but a p-type substrate may be used, and the p-type SCH layer and the n-type SCH layer may be formed on the back surface and on the surface of the active layer, respectively.

Figure 7:
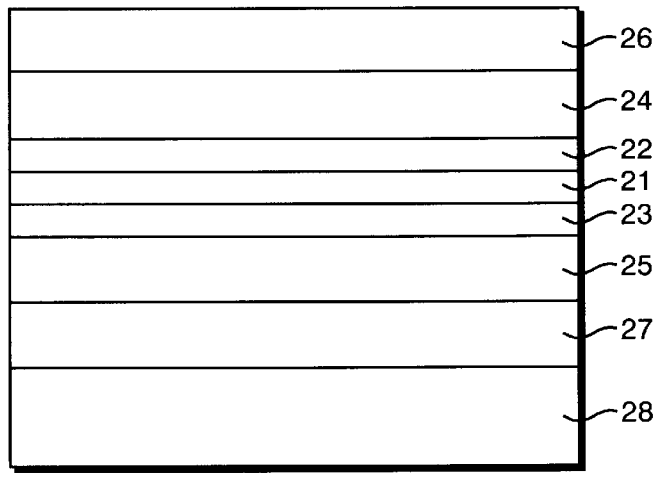
FIG. 7 is a sectional view illustrating a fundamental structure of the semiconductor laser of the present invention.

FIG. 1 shows a band structure of the semiconductor laser of the present invention having the structure shown in FIG. 7. As described above, the present invention can exert its function by allowing a part of carriers to flow from the first SCH layer to the second SCH layer at a high temperature. Therefore, it is preferred that a composition is constituted (1) so that the band gap of the second SCH layer may be larger than that of the first SCH layer, and (2) so that an energy of a bottom of a conduction band of the second SCH layer may be higher than a quasi Fermi level of electrons at room temperature and may be lower than that of the electrons at the high temperature.

Figure 5:
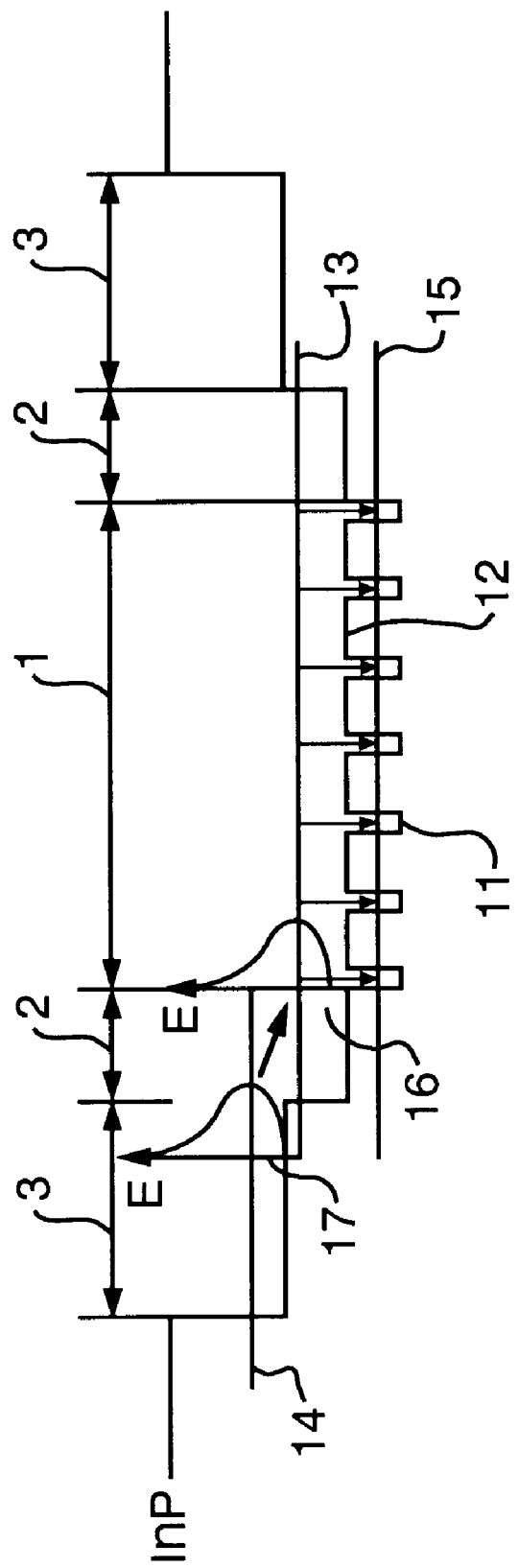
FIG. 5 is an illustrative view of a carrier injection state in a two-stage SCH structure.
Figure 6:
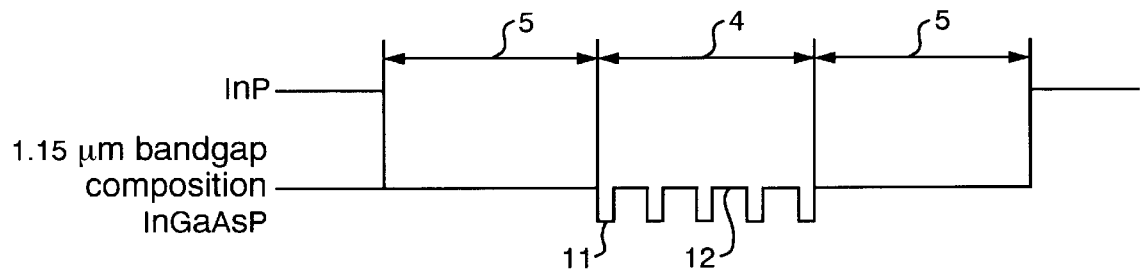
FIG. 6 shows a band structure of the conventional semiconductor laser.

In the present invention, it is at least necessary that the n-type SCH layer has the multi-layer structure. Furthermore, the thickness of the first SCH layer is preferably in the range of 10 to 60 nm, more preferably 10 to 40 nm. The reason why the layer thickness is preferably 10 nm or more is as follows. FIG. 5 is an illustrative view of a carrier injection state to the strained MQW layer 1 and the SCH layers in the case that the SCH layers each has a two-stage structure. In the first and second SCH layers, three-dimensional levels are present, respectively, and the first and second SCH layers have energy distributions 16, 17 shown in the drawing, respectively. The carriers are injected from a three-dimensional level 14 of the second SCH layer 3 to a three-dimensional level 13 of the first SCH layer 2, while they are cooled. In succession, the carriers are injected from this three-dimensional level 13 to a laser wave oscillation base level 15, while phonons are released. Therefore, when the second SCH layer 3 is sufficiently distant from the first SCH layer 2 so as to cool the carriers, the injection efficiency of the carriers of from the second SCH layer 3 to the first SCH layer 2 can be enhanced. Thus, it is effective for efficiency improvement at the high temperature that the thickness of the first SCH layer 2 is 10 nm or more. In addition, it is also effective that the thickness of the first SCH layer 2 is 60 nm or less, because the increase of the internal loss caused by the deterioration of the carrier transportation efficiency can be inhibited.

EXAMPLE 1

Figure 2:
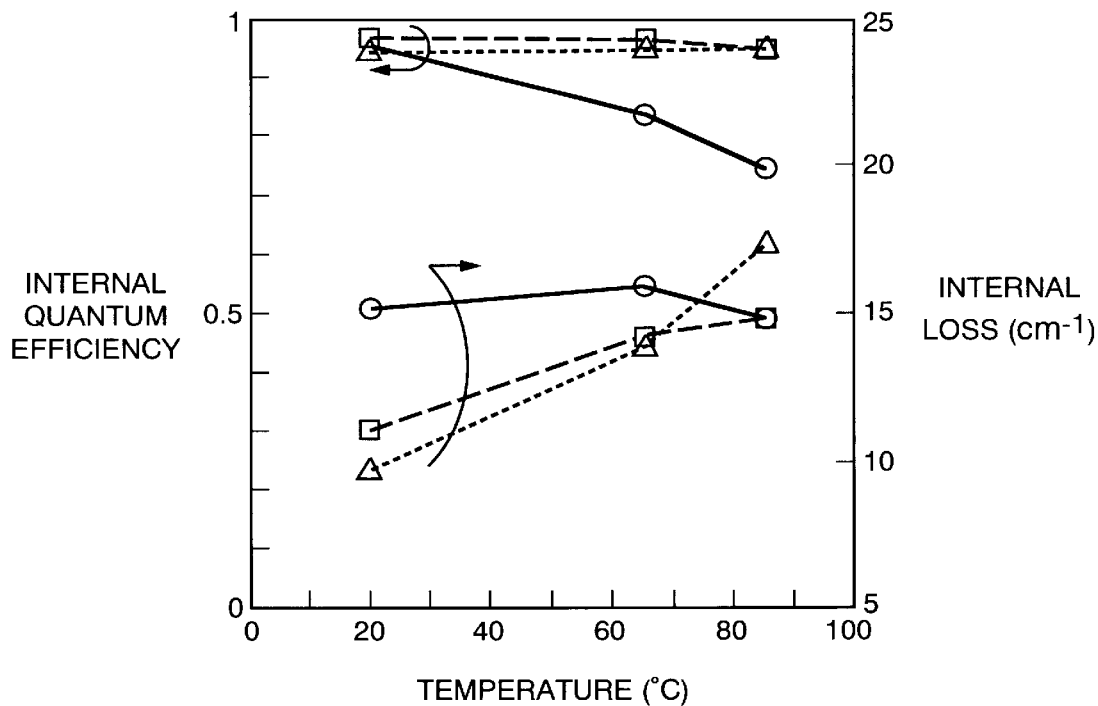
FIG. 2 shows a temperature dependency of an internal quantum efficiency and an internal loss of the semiconductor laser of the present invention and a conventional semiconductor laser.
Figure 3:
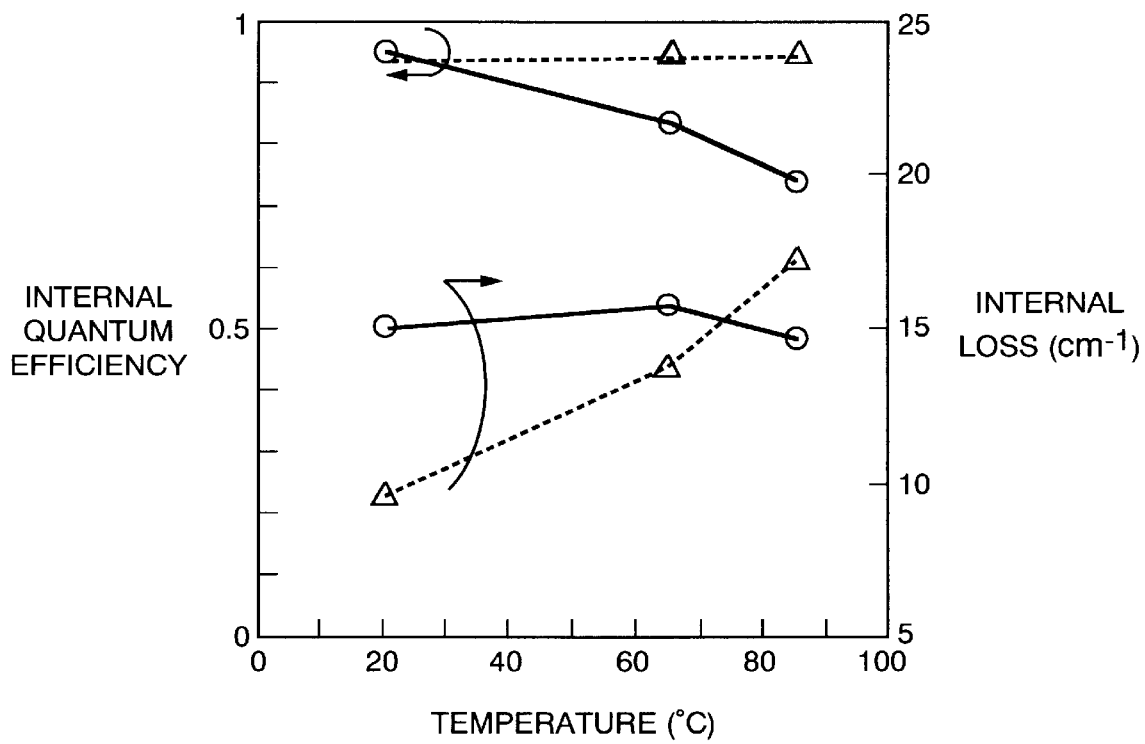
FIG. 3 shows a temperature dependency of an internal quantum efficiency and an internal loss of a conventional semiconductor laser.
Figure 4:
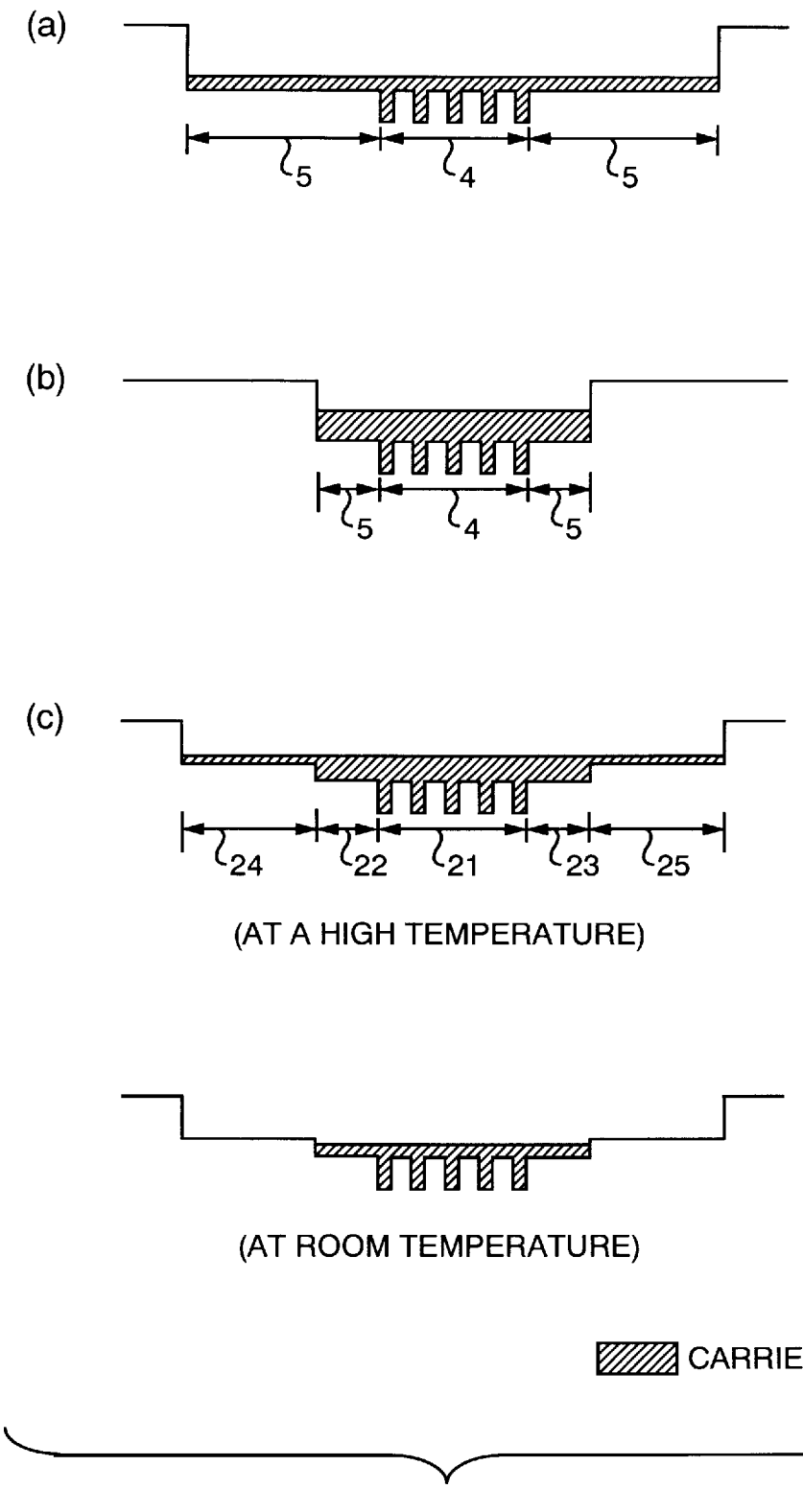
FIG. 4 shows a band structure illustrating a model of carrier accumulation in a steady state.

FIG. 1 shows a band structure of an MQW (multi quantum well) active layer of a semiconductor laser according to the present invention. A strained multi quantum well active layer 21 comprises a compressive strained InGaAsP having 7 well layers (a well layer 11 is 0.7% compressive strained InGaAsP and has a thickness of 5 nm, and a barrier layer 12 is 1.13 $\mu$m bandgap composition InGaAsP and has a thickness of 10 nm and a light-emitting wavelength of 1.3 $\mu$m). On both the surfaces of the MQW layer 21, there were formed first SCH layers 22, 23 (1.13 $\mu$m bandgap composition InGaAsP, thickness=20 nm) and second SCH layers 24, 25 (1.05 $\mu$m bandgap composition InGaAsP, thickness= 40 nm), respectively. This active layer is used as a planer type buried laser. The measured results of a temperature dependency of an internal quantum efficiency and an internal loss are shown in FIG. 2 [(c) in FIG. 2]. For comparison, the evaluation results of lasers comprising a single SCH layer (1.13 $\mu$m bandgap composition InGaAsP) of the same MQW structure and having a layer thickness of 60 nm [(a) in FIG. 2] and a layer thickness of 40 nm [(b) in FIG. 2] are also shown together in FIG. 2. It is apparent that in the laser of the present invention, the internal quantum efficiency is high in a wide temperature range, and the internal loss at the high temperature is smaller than the laser having the single SCH layer of 40 nm in thickness. Next, this laser having the 2-stage SCH structure was evaluated under conditions that a cavity length is 200 $\mu$m, a front facet surface coating ratio is 30% and a rear facet coating ratio is 90%, and as a result, it was apparent that at room temperature, a threshold current was 4 mA and a slope efficiency was 0.56 W/A; and at 85° C., the threshold current was 16 mA, the slope efficiency was 0.4 W/A and an output was 20 mW or more. On the other hand, the laser having the single SCH structure of 60 mn in thickness was evaluated under the same conditions regarding the resonator length and the facet coating ratios, and as a result, it was apparent that at room temperature, the threshold current was 5 mA and the slope efficiency was 0.45 W/A; and at 85° C., the threshold current was 17 mA, the slope efficiency was 0.38 W/A. As understood from the above, the semiconductor laser of the present invention is more excellent in the slope efficiency at the high temperature and room temperature as compared with the conventional case. The laser of the present invention can be driven with a high efficiency even at the high temperature.

What is claimed is:

1. A semiconductor laser which comprises an active layer, and a p-type SCH layer and an n-type SCH layer which sandwich the active layer from upper and lower sides, wherein the n-type SCH layer comprises a multi-layer structure of 2 or more layers, and this multi-layer structure is constituted so that the band gaps of the respective layers may increase as the multi-layer structure is apart from the active layer, wherein an energy of a bottom of a conduction band of one of the n-type SCH layers is higher than a quasi Fermi level of electrons at room temperature and lower than a quasi Fermi level of the electrons at a high temperature.

2. The semiconductor laser according to claim 1 wherein the p-type SCH layer comprises a multi-layer structure of 2 or more layers, and this multi-layer structure is constituted so that the band gaps of the respective layers may increase as the multi-layer structure is apart from the active layer.

3. The semiconductor laser according to claim 1 wherein each thickness of the p-type SCH layer and the n-type SCH layer which sandwich the active layer from upper and lower sides is in the range of 10 to 60 nm.

4. The semiconductor laser according to claim 1 wherein the active layer has a multi-quantum well structure or a strained quantum well structure.

5. The semiconductor laser according to claim 1 wherein the one of the n-type SCH layers is second from the active layer and wherein the energy of the bottom of the conduction band is lower than a quasi Fermi level of the electrons at 85° C.

6. A semiconductor laser, comprising:
   (a) an active layer;
   (b) an n-type SCH layer disposed on a first side of the active layer; and
   (c) a p-type SCH layer disposed on a second side of the active layer opposite to the first side, wherein one of the SCH layers includes at least a first layer and a second layer, the first layer being between the second layer and the active layer and having a bandgap less than a bandgap of the second layer, wherein an energy of a bottom of a conduction band of one of the SCH layers is higher than a quasi Fermi level of electrons at room temperature and lower than a quasi Fermi level of the electrons at a high temperature.

7. A semiconductor laser, according to claim 6, wherein the first and second layers are part of the n-type SCH layer.

8. A semiconductor laser, according to claim 7, wherein the p-type SCH layer includes at least a third layer and a fourth layer, the third layer being between the fourth layer and the active layer and having a bandgap less than a bandgap of the fourth layer.

9. A semiconductor laser, according to claim 6, wherein the first and second layers are part of the p-type SCH layer.

10. A semiconductor laser, according to claim 9, wherein the n-type SCH layer includes at least a third layer and a fourth layer, the third layer being between the fourth layer and the active layer and having a bandgap less than a bandgap of the fourth layer.

11. A semiconductor laser, according to claim 6, wherein the first layer has a thickness between 10 nm and 60 nm.

12. A semiconductor laser, according to claim 11, wherein the first layer has a thickness between 10 nm and 40 nm.

13. A semiconductor laser, according to claim 6, wherein the active layer is one of: a multi-quantum well structure and a strained quantum well structure.

14. A semiconductor laser, according to claim 6, wherein the second layer has an energy of a bottom of a conduction band that is higher than a quasi Fermi level of electrons at room temperature and lower than a quasi Fermi level of the electrons at 85° C.

15. A semiconductor laser, comprising:
   (a) an active layer;
   (b) an n-type SCH layer disposed on a first side of the active layer;
   (c) a p-type SCH layer disposed on a second side of the active layer opposite to the first side; and
   (d) means for maintaining in the laser a relatively high internal quantum efficiency and a relatively low internal loss as temperature of the laser is increased, wherein an energy of a bottom of a conduction band of one of the SCH layers is higher than a quasi Fermi level of electrons at room temperature and lower than a quasi Fermi level of the electrons at a high temperature.

16. A semiconductor laser, according to claim 15, wherein the active layer is one of: a multi-quantum well structure and a strained quantum well structure.

17. A semiconductor laser, according to claim 15, wherein the means for maintaining includes first and second layers that are part of at least one of the SCH layers, the first layer being between the active layer and the second layer and having a bandgap that is less than a bandgap of the second layer.

18. A semiconductor laser, according to claim 17, wherein the second layer has an energy of a bottom of a conduction band that is higher than a quasi Fermi level of electrons at room temperature and lower than a quasi Fermi level of the electrons at 85° C.

19. A semiconductor laser, according to claim 17, wherein the first layer has a thickness between 10 nm and 60 nm.

20. A semiconductor laser, according to claim 19, wherein the first layer has a thickness between 10 nm and 40 nm.

* * * * *